United States Patent [19]

Buttry et al.

[11] Patent Number: 4,619,731

[45] Date of Patent: Oct. 28, 1986

[54] PROCESS FOR ETCHING VIA HOLES IN ALUMINA

[75] Inventors: Daniel A. Buttry, Laramie, Wyo.; Mohamad T. Krounbi, San Jose; Owen R. Melroy, Morgan Hill, both of Calif.

[73] Assignee: International Business Machines Corporation, Armonk, N.Y.

[21] Appl. No.: 792,409

[22] Filed: Oct. 29, 1985

[51] Int. Cl.[4] .................. B44C 1/22; C03C 15/00; C03C 25/06
[52] U.S. Cl. .................... 156/644; 156/637; 156/655; 156/659.1; 156/667; 252/79.5
[58] Field of Search .............. 156/644, 655, 659.1, 156/664, 667, 637, 666; 252/79.5; 134/2

[56] References Cited

U.S. PATENT DOCUMENTS

| | | | |
|---|---|---|---|
| 3,923,559 | 12/1975 | Sinha | 148/1.5 |
| 4,251,621 | 2/1981 | Fraley et al. | 430/312 |
| 4,339,281 | 7/1982 | Chio | 134/1 |
| 4,461,818 | 7/1984 | Suzuki et al. | 430/49 |

FOREIGN PATENT DOCUMENTS

51149830-A  6/1977  Japan .

*Primary Examiner*—William A. Powell
*Attorney, Agent, or Firm*—Joseph G. Walsh

[57] ABSTRACT

Via holes are etched in an alumina layer using an etchant bath of ethylenediaminetetraacetic acid at a pH above 9.

5 Claims, No Drawings

PROCESS FOR ETCHING VIA HOLES IN ALUMINA

DESCRIPTION

1. Technical Field

The present invention is concerned with a process for etching via holes in an alumina layer.

2. Background Art

During many processes in the manufacturing of electronic components, alumina is used as an insulating spacer interposed between metal layers. It is often necessary to provide via holes in the alumina to connect the metal layers. The most commonly used method for making such via holes currently employs hot phosphoric acid. The procedure, however, has several serious disadvantages. In particular, the acid attacks the metallic underlayers.

The use of ethylenediaminetetraacetic acid as an etchant for titanium is shown, for example, in U.S. Pat. Nos. 3,923,559, 4,251,621 and 4,339,281. U.S. Pat. No. 4,461,818 shows ethylenediaminetetraacetic acid as part of a multi component etching solution used to etch a printing plate.

J51149830-A(7706) shows the use of ethylenediaminetetraacetic acid to remove black discoloring film on aluminum.

DISCLOSURE OF THE INVENTION

According to the present invention via holes are etched in an alumina layer by contacting selected areas of said layer with an etching bath comprising an aqueous solution of ethylenediaminetetaacetic acid at a pH above 9. The process is preferably carried out at a temperature at or above 25° C. and it is best done under conditions in which the bath is agitated. The pH of the etch bath may be adjusted to the desired level by the addition of sodium hydroxide. It is also advantageous to add a surfactant to the bath.

The ethylenediaminetetraacetic acid concentration is not critical. A saturated solution is satisfactory, and a dilute solution also works, but is not as good a buffer. For that reason, a concentrated solution is preferred.

The via holes in practice may be defined through standard photolithographic methods, following which the exposed alumina is etched with the etchant bath. The etchant bath of the present invention attacks the alumina but does not attack the metallic underlayers. Furthermore, it is fast and non-toxic.

As an example of a preferred method of carrying out the present invention, a bath was composed of 52 grams per liter of disodium ethylenediaminetetraacetic acid in water with the pH adjusted with sodium hydroxide. At a pH of 10, the etch rate varied from 365 to 1070 angstroms per minute for temperatures of 50° C. and 55° C., respectively. Increasing the pH to 10.7 gave a rate of 550 angstroms per minute at 50° C. The addition of a small amount of a surfactant (FC-95) to the bath resulted in a decrease of etch rate and an increase of uniformity. Its presence is desirable because it inhibits adhesion of bubbles at the surface.

We claim:

1. A process for etching via holes in an alumina layer comprising contacting selected areas of said layer with an etchant bath comprising an aqueous solution of ethylenediaminetetraacetic acid at a pH above 9.

2. A process as claimed in claim 1 wherein the temperature is at or above 25° C.

3. A process as claimed in claim 1 wherein the contacting is done under conditions in which the bath is agitated.

4. A process as claimed in claim 1 in which the pH of the etchant bath is adjusted by the addition of sodium hydroxide.

5. A process as claimed in claim 1 in which a surfactant is added to the etch bath.

* * * * *